United States Patent

[11] 3,555,282

[72] Inventors Hisayoshi Yanai, Toshiaki Ikoma, Takayuki Sugeta, Yasuo Matsukura, Kuniichi Ohta, Tokyo, Japan

[21] Appl. No. 748,680
[22] Filed July 30, 1968
[45] Patented Jan. 12, 1971
[73] Assignee Nippon Electric Company, Limited Tokyo, Japan
[32] Priority July 31, 1967
[33] Japan
[31] 42/49,215

[54] RADIATION SENSITIVE SWITCHING SYSTEM EMPLOYING A SEMICONDUCTOR ELEMENT
5 Claims, 9 Drawing Figs.

[52] U.S. Cl. .......... 250/211, 317/235
[51] Int. Cl. .......... H01i 15/00
[50] Field of Search .......... 250/211; 317/235—27; 331/107; 307/311, 312, 117

[56] References Cited

UNITED STATES PATENTS 3,439,290 4/1969 Shinoda .......... 331/107
3,440,425 4/1969 Hutson et al. .......... 317/235X

OTHER REFERENCES

Northrup et al.: Solid State Electronics; Vol. 7, No. 1; Jan. 1964; pp. 17—30

Ridley et al.: Journal of Physics & Chemistry of Solids; Vol. 26, No. 1, Jan 1965; pp. 21—31

*Primary Examiner*—Walter Stolwein
*Attorney*—Hopgood and Calimafde

ABSTRACT: A device is described for generating the beam effect in a semiconductor suitable therefor by applying a source of light at a portion of the semiconductor material to lower the resistance thereof and effectively raise the field intensity elsewhere in the semiconductor. The field intensity is produced by applying a voltage source across the semiconductor with a level selected to produce an electric field intensity in the material that is less than that necessary to produce Gunn oscillations but which is sufficiently high to permit the light source to trigger the semiconductor into high field domain Gunn oscillations.

PATENTED JAN 12 1971 3,555,282

INVENTORS
HISAYOSHI YANAI
TOSHIAKI IKOMA
TAKAYUKI SUGETA
YASUO MATSUKURA
KUNIICHI OHTA

BY Hopgood & Calimafde
ATTORNEYS

INVENTORS
HISAYOSHI YANAI
TOSHIAKI IKOMA
TAKAYUKI SUGETA
YASUO MATSUKURA
KUNIICHI OHTA
BY
Hopgood & Calimafde
ATTORNEYS

RADIATION SENSITIVE SWITCHING SYSTEM EMPLOYING A SEMICONDUCTOR ELEMENT

Figure 2:
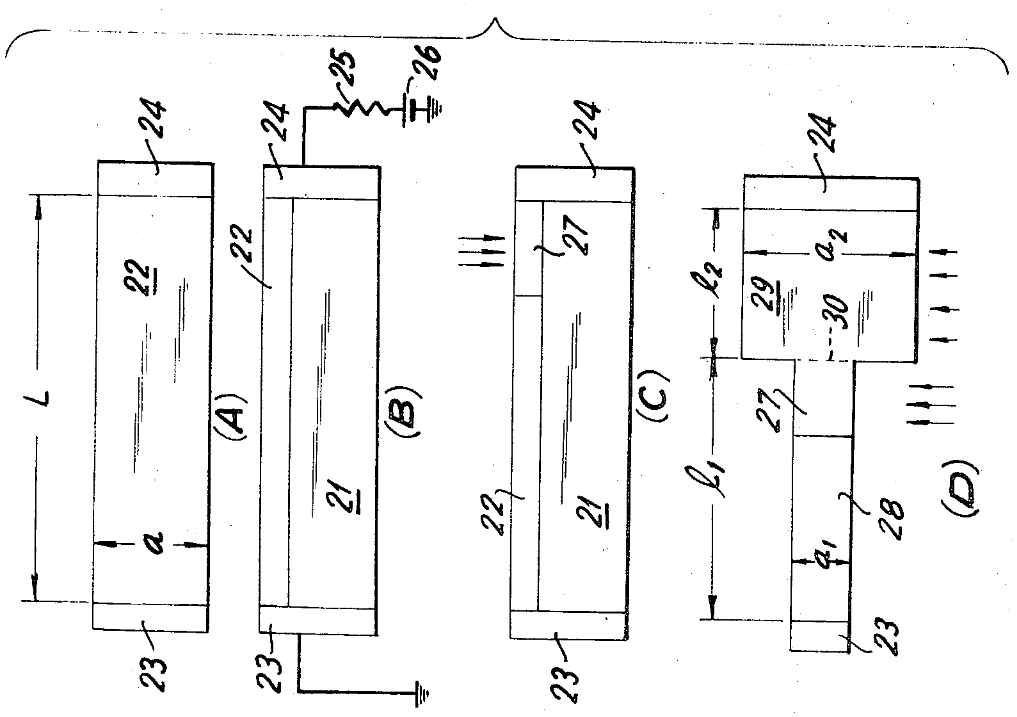
FIGS. 2A and 2B are respectively elevation and films views of a switching semiconductor element according to one embodiment of the invention.
FIGS. 2C and 2D are views similar to FIGS. 2A and 2B of second embodiment of the invention.

This invention relates to a switching system utilizing an electrical dipole layer of high electric field (hereinafter called as high field domain) created in those semiconductor crystals which exhibit a bulk negative differential conductivity (GaAs, InP etc. and semiconductors such as Ge and Si with deep traps) as well as in piezoelectric semiconductors.

The PN junction diode, transistor, Schottky diode, etc. have been commonly used as switching devices. However, it is difficult to attain a switching speed faster than $10^{-9}$ second by means of these devices, even by the use of a Schottky barrier diode.

A Gunn diode is a novel device based on the principle that, when a strong bias voltage is applied on a single crystal of gallium arsenide (GaAs), a high field domain quickly grows near the cathode of the diode and then propagates towards the anode in the direction of the electrical field. Its mechanism may be more completely understood by referring to "-Microwave Semiconductor Devices and Their Circuit Application" Chapter 16, published by McGraw-Hill Book Co. This type of diode operates as a switching device at a considerably high speed. The Gunn oscillator operates under a strong bias voltage, which must be adjusted to suitable values for a continuous wave (CW) oscillation mode. However, the breakdown of the diode due to the Joule heat caused by the high field intensity is likely to occur during its operation under a higher field intensity.

The principal object of the present invention is therefore to provide a switching system or apparatus which can be operated with high stability and can easily create the high field domain for the excitation of oscillation.

The switching system according to the present invention comprises a Gunn effect element maintained at a lower bias voltage than the threshold voltage for generating the high field domain, and a triggering light pulse for partially irradiating to the element, whereby the high field domain is created.

Since the high field domain is created by producing the electron-hole pairs inside the Gunn effect element by the light pulse, the applied bias voltage can be lowered, and this improves the stability of the element and the control of the oscillation.

The invention will be clearly understood with reference to the following description taken in conjunction with the accompanying drawings.

The reason why the high field domain known as the Gunn effect domain is generated may be described as follows. The conduction band of the gallium arsenide crystal comprises a deep valleylike portion where an electron has a small effective mass and lower energy, and a higher valley where an electron has a large effective mass and a higher energy. The electrons are therefore accelerated by the high electric field, causing the redistribution of the electrons in these two valleys. This mechanism of the Gunn effect is described in "Microwave Semiconductor Devices and Their Circuit Applications", chapter 16 published by McGraw-Hill Co. Namely, when the electrons are accelerated by the high electric field to become hot, the mobility of the electrons becomes strongly dependent on the electric field due to the strong dependence of the electron temperature on the electric fields. The increase in the electric field intensity causes the number of electrons in the upper subbands of large effective mass to become larger, resulting in the appearance of an electric field region exhibiting a negative differential conductivity. As a result, a local high field domain appears under certain proper conditions and propagates in the crystal until it disappears. The mechanism of the Gunn effect in gallium arsenide entirely originates with the behavior of such a high field domain. When a high electric field is impressed across the gallium arsenide crystal of a rectangular solid form, there is a relationship between the excess domain voltage $V_d$ and the electric field $F_l$ in the low electric field part such that $V_d = V - F_l$ where V is the voltage impressed across the sample and L is the length of the sample. On the other hand, there is a unique relation for the gallium arsenide between $V_d$ and $F_l$ which is determined by the specific resistance only.

Figure 1:
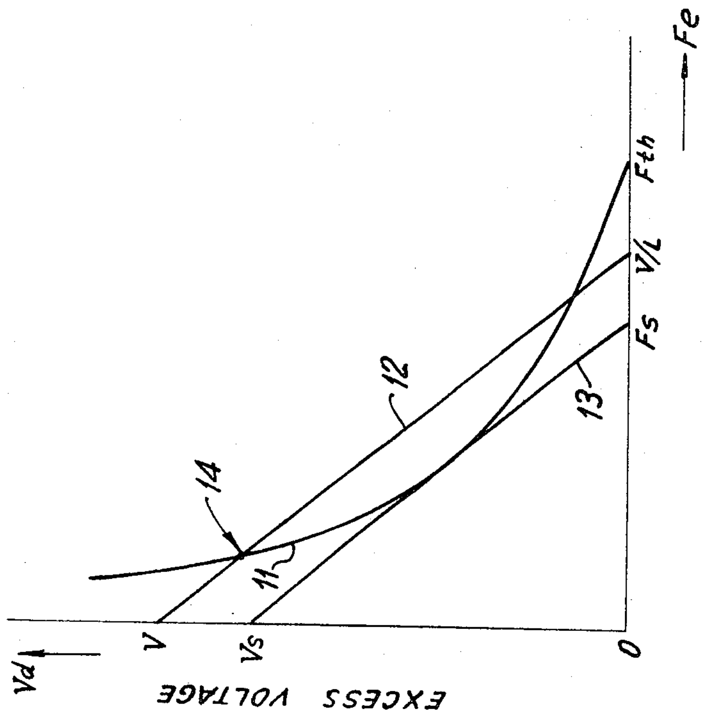
FIG. 1 is a graphical diagram explaining the creation of the high electric field electrical dipole layer in the semiconductor crystal of the invention.

Referring to FIG. 1 which plots the low electric field $F_l$ on the abscissa and the excess domain voltage $V_d$ on the ordinate, the relation between the electric field inherent to the specific resistance and the domain voltage is shown by curve 11, and the domain voltage $V_d$ against the applied voltage to the crystal V is given by the load line 12. Curve 11 has a threshold value $F_{th}$ for generating the high field domain, at $V_d = 0$. If the applied electric field is larger than the threshold value $F_{th}$, the generation and disappearance of the high field domain in the vicinity of the cathode and its disappearance at the anode are repeated so that oscillation of microwave frequency region is obtained. The load straight line 13 tangential to the curve 11 gives the minimum value $V_d$ or $F_1$ (which is designated as $V_s$ and $F_s$ respectively in FIG. 1) needed for sustaining the high field domain once it is generated in the crystal in which this high field domain has been generated by a certain means, and the applied voltage at that time is the minimum sustaining voltage $V_s$ and the minimum sustaining electric field $F_s$. Therefore, when the impressed voltage V is at a value to make the inner electric field V/L at a value between the minimum sustaining electric field $F_s$ and the threshold value $F_{th}$, the crystal does not generate the high field domain in such a state. However, by applying a triggering electric field from outside the inner electric field is raised beyond the threshold electric field $F_{th}$ and the high field domain can be generated. The response time under this condition is very short corresponding to the growth time for the high field domain amounting to the order from $10^{-11}$ to $10^{-12}$ sec. Conversely, when the electric field of the low electric field region near the high field domain is lowered below the sustaining electric field $F_s$ by applying from outside a triggering voltage in the opposite direction as a trigger, it is possible to extinguish the high field domain.

The present invention provides a system including a Gunn diode crystal in which the applied electric field is larger than the sustaining field but lower than the threshold field, and then the triggering light pulse is irradiated to generate the high field domain.

FIGS. 2(A) and (B) respectively indicate a plan view and a side view of a switching element according to one of the preferred embodiments of the invention. In the drawings, the semiconductor device consists of a highly insulating substrate 21 of gallium arsenide with length L and width a as well as an *n*-type epitaxial layer 22 of gallium arsenide with a thickness of 10 to 20 $\mu$and doped with tellurium of a concentration of $10^{12}$ to $10^{16}$ atoms/cm$^3$. Ohmic contacts are fabricated to the epitaxial layer 22 as the cathode 23 and the anode 24. A resistor 25 and a battery 26 are connected in series with the element. In this arrangement, most of the electric current flows through the single crystal layer 22 due to the high insulation of the substrate 21. By adjusting the bias voltage of the battery 26, the electric field in the crystal layer 22 can be made stronger than the sustaining electric field $F_s$ and weaker than the threshold value $F_{th}$ as shown in FIG. 1 by the straight line 12.

Under these conditions, if the triggering light pulse is partially irradiated onto the crystal layer 22, the creation of the high field domain can be controlled depending on the strength, area, and the location of the irradiation. These facts will be described in detail hereunder.

As shown in the embodiments of FIGS. 2(C) and 2(D), when a triggering light pulse having a shorter wavelength than that corresponding to the threshold energy for exciting electron-hole pairs is irradiated locally onto the portion 27 of the crystal layer near the anode 24, the electrical conductivity of the portion irradiated by the triggering light pulse is increased by the electron-hole pairs created by the light trigger pulse. Then, the nonirradiated portion of the crystal layer will have a higher field strength at a given bias voltage. If this higher field strength exceeds the threshold value $F_{th}$, a high field domain is created at the cathode 23 and propagates to the anode 24. When the high field domain arrives at the anode, it disappears. The appearance of the high field domain in the single crystal layer 22 decreases the current flowing through the layer 22, and such variation of the current is picked up from the load 25.

Figure 3:
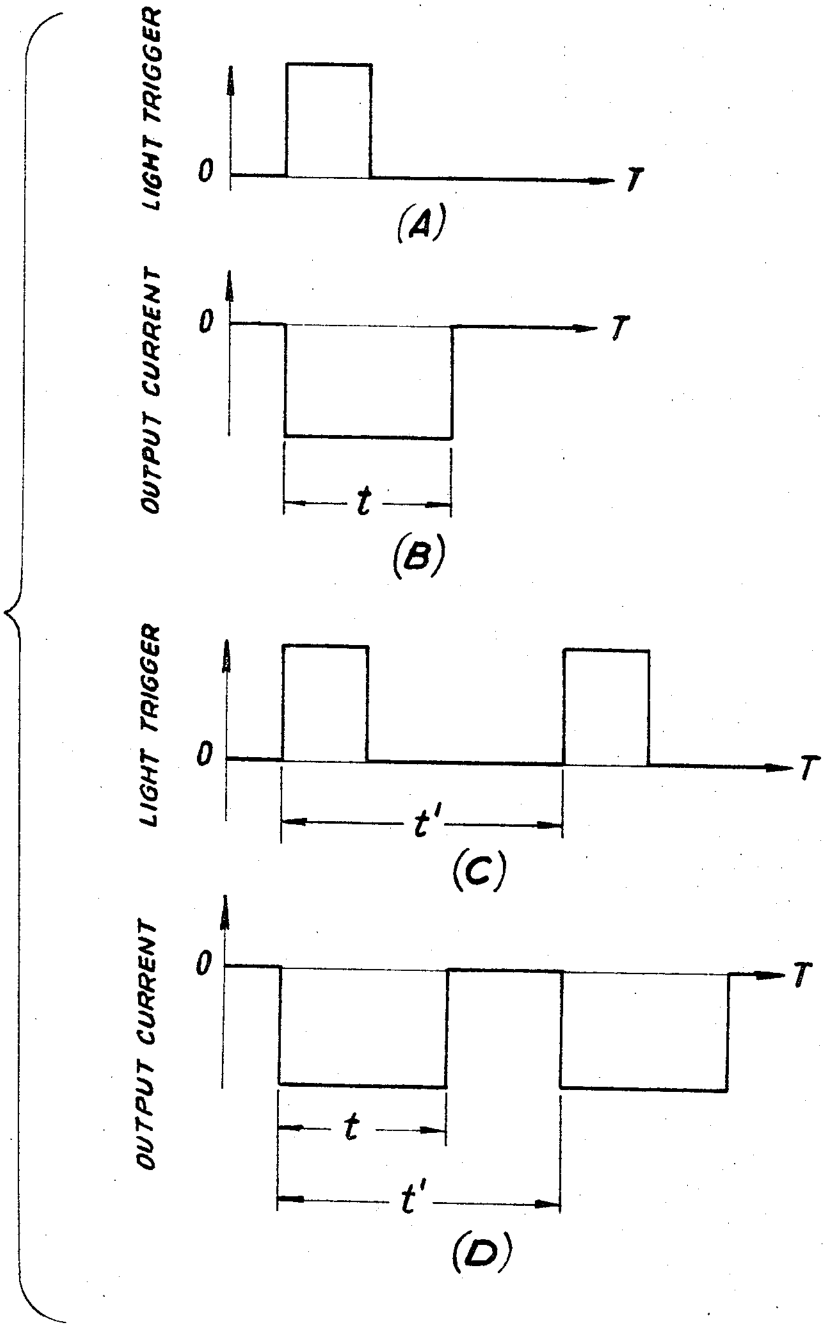
FIGS. 3A—3D illustrate input and output wave forms and showing the switching elements of the invention.

FIG. 3 indicates the input light waveforms and the output current waveforms with duration T which are obtained in the case where the structure of the diode and the interconnections as illustrated in FIG. 2 are employed.

FIG. 3(A) indicates the waveform for the input light pulse, while FIG. 3(B) indicates the output current waveform obtained from the load 25. The current pulse of FIG. 3(B) has the pulse width $t$ expressed as $$t = L/v,$$

where L represents the length of the element and $v$ denotes the drift velocity of the high field domain. The rise time of the pulse is very near to the growth time for the high field domain which is of the order of $10^{-11}$ to $10^{-12}$ sec. From this value, it is apparent that an extremely high speed switch can be realized in this manner.

FIG. 3(B) also shows that the fall time of the output pulse is also of the same order of $10^{-11}$ to $10^{-12}$ sec. When the light trigger pulse is applied successively, the same cycles are repeated.

In other words, when the light trigger pulse as shown in FIG. 3(C) is applied to the crystal layer 22, a pulse as indicated in FIG. 3(D) having a rise time and a fall time of $10^{-11}$ sec. to $10^{-12}$ sec. is created. In this case also, the pulse width is expressed by $t = L/v$ and the repetition period $t'$ is that of the trigger pulses.

In the case where the length L of the semiconductor crystal is 500$\mu$ and the width $a$ is 100$\mu$, the pulse width $t$ is about 5 nanosec. since the drift velocity of the high field domain is about $10^7$ cm/sec. The intensity of the light pulse at the irradiated surface is about 10 watts and the reflection coefficient of the material of this crystal is about 0.3.

Furthermore, the minimum sustaining field intensity of this specimen was 1.6 kV/cm, and the applied voltage 150V supplied from the battery 26 in the arrangement shown in FIG. 2(B) is sufficient for this value of the sustaining field.

Although in the above operation the high field domain created at the cathode propagates up to the anode 24, it is also possible to extinguish the high field domain at an intermediate location of the crystal layer.

FIG. 2(D) is a plan view of a switching element of this type having a first crystal region 28 with a width $a_1$, a length $l_1$, and a second crystal region 29 with a width $a_2$ and a length $l_2$. Each of the regions 28 and 29 has the same thickness. A bias voltage applied to the element constructed in this way is so adjusted that the internal electric field of the first crystal region 28 is higher than the sustaining field $F_s$ and lower than the threshold field $F_{th}$ to create the high field domain in this region, while the internal field of the second crystal region 29 is lower than the sustaining field intensity $F_s$ in the second crystal region 28. When the light pulse is irradiated on this element as in the case of FIG. 2(C), the high field domain created in the first crystal region 28 propagates toward the second crystal region 29 and disappears at the boundary 30 of these two regions 28 and 29. In this case, the output waveform picked up from the load 25 will be as shown in FIG. 3(B) corresponding to the input waveform of FIG. 3(A), and the pulse width $t$ of the output pulse will be $l_1/v$. It is apparent that when the input waveform of FIG. 3(C) is applied, the output pulse of FIG. 3(D) is obtained and the pulse width thereof is given by $t = l_1/v$.

Although in the above explanation, gallium arsenide of $n$-type was given as an example, it is possible that other shapes and other semiconductor crystals exhibiting the Gunn effect may be employed for the same purpose, and by the above described procedure, the Gunn oscillation can be easily initiated in all of these materials. Moreover, the same procedure can be applied to all of the cases wherein the oscillation is caused by the high field domain which can be generated in crystals exhibiting the bulk negative differential conductivity (such as GaAs, InP etc. and semiconductors with deep trapping centers) as well as in piezoelectric semiconductors (CdS etc.). The pulse generating system according to the present invention employing the light trigger pulse can be applied to all of these cases.

MOreover, if a semiconductor laser element is employed as the light pulse source, it is possible to fabricate the semiconductor laser element and the Gunn effect element on the same semiconductor substrate.

Although the present invention has been described on the basis of some of its preferred embodiments, it is apparent that various modifications can be obtained without departing from the spirit and scope of the present invention.

We claim:

1. A switching device comprising a semiconductor crystal capable of forming a high field domain resorting to the bulk effect negative resistance, an anode and a cathode in ohmic contact with said crystal, a load and an electric biasing source connected in series with said crystal for biasing said crystal to an electric field below the threshold value for forming said high field domain; and a source of light rays for irradiating a portion of said crystal to initiate formation of said high field domain for a time period shorter than the current pulse width $t$ specific to said crystal, said $t$ being given by the expression $t = L/v$, where L is the length of said crystal, and $v$ is the drift velocity of the high field domain.

2. The device as recited in claim 1, wherein said crystal contains $n$-type impurities of $10^{12}$ to $10^{16}$ atoms/cm$^3$ and wherein said high field domain is formed resorting to the Gunn effect.

3. The device as recited in claim 1, wherein said light rays are caused to selectively radiate the portion of the crystal near said anode.

4. The device as recited in claim 1, wherein said crystal has high and low field portions and wherein said light rays are directed to irradiate said low electric field portion.

5. The device as recited in claim 4, wherein said light rays are caused to selectively radiate the portion of the crystal near said anode.